(12) United States Patent
Wang (10) Patent No.: US 9,722,413 B2
(45) Date of Patent: Aug. 1, 2017

(54) DEVICES FOR GROUND-RESISTANCE DETECTION

(71) Applicant: Delta Electronics, Inc., Taoyuan (TW)

(72) Inventor: Ming-Whang Wang, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 26 days.

(21) Appl. No.: 14/846,295

(22) Filed: Sep. 4, 2015

(65) Prior Publication Data

US 2016/0313385 A1 Oct. 27, 2016

(30) Foreign Application Priority Data

Apr. 27, 2015 (TW) .............................. 104113347 A (51) Int. Cl.
H02H 3/00 (2006.01)
H02H 3/16 (2006.01)
G01R 27/18 (2006.01)
H02H 11/00 (2006.01)

(52) U.S. Cl.
CPC ............ *H02H 3/165* (2013.01); *G01R 27/18* (2013.01); *H02H 3/162* (2013.01); *H02H 11/005* (2013.01); *Y02T 90/168* (2013.01); *Y04S 30/12* (2013.01)

(58) Field of Classification Search
USPC ................................................ 361/42, 86–87
See application file for complete search history.

(56) References Cited

U.S. PATENT DOCUMENTS

| 5,057,965 | A | * | 10/1991 | Wilson | G01R 31/026 |
| | | | | | 324/538 |
| 7,023,680 | B1 | * | 4/2006 | Johnson | H02H 9/042 |
| | | | | | 324/74 |
| 8,339,270 | B2 | | 12/2012 | Silverman et al. | |
| 2003/0067723 | A1 | * | 4/2003 | Suzui | H02H 3/337 |
| | | | | | 361/42 |
| 2011/0313613 | A1 | * | 12/2011 | Kawahara | H01M 10/441 |
| | | | | | 701/34.4 |
| 2016/0258993 | A1 | * | 9/2016 | Bagchi | G01R 31/025 |

FOREIGN PATENT DOCUMENTS

| CN | 102288834 A | 12/2011 |
| CN | 101685130 B | 8/2014 |
| EP | 0763745 B1 | 6/2009 |
| TW | 201303318 A | 1/2013 |

\* cited by examiner

*Primary Examiner* — Danny Nguyen
(74) *Attorney, Agent, or Firm* — Muncy, Geissler, Olds & Lowe, P.C.

(57) ABSTRACT

A ground-resistance detection device, which is coupled to a power system including a first power line, a second power line, and a protective earth, includes a ground-resistance detection circuit and a controller. The ground-resistance detection circuit includes a first input node and a second input node. The first input node is coupled to either the first power line or the second power line. The second input node is coupled to a ground terminal. The ground-resistance detection circuit generates a DC output voltage according to the voltage of the first input node, the voltage of the second input node, and the DC reference voltage. The controller determines the ground resistance between the protective earth and the ground terminal according to the DC reference voltage and the DC output voltage.

10 Claims, 4 Drawing Sheets

DEVICES FOR GROUND-RESISTANCE DETECTION

CROSS REFERENCE TO RELATED APPLICATIONS

This Application claims priority of Taiwan Patent Application No. 104113347, filed on Apr. 27, 2015, the entirety of which is incorporated by reference herein.

BACKGROUND OF THE INVENTION

Field of the Invention

The disclosure relates generally to devices for ground-resistance detection, and more particularly it relates to devices for measuring the resistance between ground terminal and the protective earth (PE).

Description of the Related Art

When local equipment is coupled to a power system, a lack of good grounding is undesirable, and increases the risk of equipment failure. The absence of an effective grounding system can lead to various problems, such as instrumentation errors, harmonic distortion issues, power factor problems, and a host of possible intermittent dilemmas. If fault currents have no path to the earth through a properly designed and maintained grounding system, they will find unintended paths and even may cause users to receive electric shocks.

Furthermore, a good grounding system is also used to prevent damage to industrial plants and equipment and is therefore necessary in order to improve the reliability of equipment and reduce the likelihood of damage due to fault currents, and of causing users to get electric shocks. In addition, if it is possible to know the ground resistance in advance before operating a power system, the operation of a power system with excessive high ground resistance is able to be avoided, which results in preventing the hazard in advance.

BRIEF SUMMARY OF THE INVENTION

For solving above problems, the invention provides a device for ground-resistance detection.

In an embodiment, a ground-resistance detection device comprises a ground-resistance detection circuit and a controller. The ground-resistance detection device is coupled to a power system comprising a first power line, a second power line, and a protective earth. The ground-resistance detection circuit comprises a first input node and a second input node. The first input node is coupled to either the first power line or the second power line, and the second input node is coupled to a ground terminal. The ground-resistance detection circuit generates a DC output voltage ($V_{OUT}$) according to the voltage of the first input node, the voltage of the second input node, and a DC reference voltage ($V_{REF}$). The controller determines a ground resistance ($R_{PE}$) between the protective earth and the ground terminal according to the DC reference voltage and the DC output voltage.

According to an embodiment of the ground-resistance detection device, the power system is a single-phase three-wire system, and the power system comprises a live wire, a neutral wire, and the protective earth. The first input node is coupled to either the live wire or the neutral wire.

According to an embodiment of the ground-resistance detection device, the power system is a two-phase three-wire system, and the power system comprises a first live wire, a second live wire, and the protective earth. The first live wire comprises a first phase, and the second live wire comprises a second phase. The first input node is coupled to either the first live wire or the second live wire.

According to an embodiment of the ground-resistance detection device, the power system is a three-phase four-wire system, and the power system comprises a first live wire, a second live wire, a third live wire, and the protective earth. The first live wire comprises a first phase, the second live wire comprises a second phase, and the third live wire comprises a third phase. The first input node is coupled to the first live wire, the second live wire, or the third live wire.

According to an embodiment of the ground-resistance detection device, the ground-resistance detection circuit further comprises: a first operation amplifier, a first resistor, a second resistor, a third resistor, a fourth resistor, a first capacitor, and a second capacitor. The first operation amplifier comprises a first positive input node and a first negative input node. The first operation amplifier is supplied by a DC supply voltage, and compares the voltage of the first positive input node with the voltage of the first negative input node to generate the DC output voltage at an output node. The first resistor comprises a first resistance ($R_1$) and is coupled between the first input node and the first negative input node. The second resistor comprises a second resistance ($R_2$) and is coupled between the first negative input node and the output node. The third resistor comprises a third resistance ($R_3$) and is coupled between the second input node and the first positive input node. The fourth resistor comprises a fourth resistance ($R_4$) and is coupled between a reference input node and the first positive input node. The DC reference voltage ($V_{REF}$) is supplied to the reference input node. The first capacitor is coupled between the output node and the first negative input node. The second capacitor is coupled between the first positive input node and the reference input node. The first input node comprises an AC signal, and the first capacitor and the second capacitor are configured to select a bandwidth to filter out the AC signal.

According to an embodiment of the ground-resistance detection device, the ground-resistance detection circuit further comprises a first clamp circuit. The first clamp circuit is coupled to the first negative input node and is configured to provide a clamp protection for the first negative input node.

According to an embodiment of the ground-resistance detection device, the controller obtains the ground resistance from the following equation:

$$R_{PE}=(R_3\cdot(R_1+R_2)\cdot V_{REF}-R_1\cdot(R_3+R_4)\cdot V_{OUT})/((R_3+R_4)\cdot V_{OUT}-R_3\cdot V_{REF}).$$

An embodiment of the ground-resistance detection device further comprises an AC-voltage detection circuit. The AC-voltage detection circuit comprises a third input node and a fourth input node. The third input node is coupled to the first power line, and the fourth input node is coupled to the second power line. The AC-voltage detection circuit generates a detection voltage according to an AC voltage between the third input node and the fourth input node. The detection voltage comprises a DC-part voltage ($V_{DC}$) and an AC-part voltage. The controller determines the AC voltage ($V_M$) according to amplitude of the AC-part voltage, and determines the ground-resistance according to the DC-part voltage and the DC output voltage.

According to an embodiment of the ground-resistance detection device, the AC-voltage detection circuit comprises a second operation amplifier, a fifth resistor, a sixth resistor, a seventh resistor, an eighth resistor, a third capacitor, and a fourth capacitor. The second operation amplifier comprises a second positive input node and a second negative input node. The second operation amplifier receives a DC supply voltage and compares the voltage of the second positive input node with the voltage of the second negative input node to generate the detection voltage at a detection voltage node. The fifth resistor comprises a fifth resistance ($R_5$) and is coupled between the third input node and the second negative input node. The sixth resistor comprises a sixth resistance ($R_6$) and is coupled between the second negative input node and the detection voltage node. The seventh resistor comprises a seventh resistance ($R_7$) and is coupled between the fourth input node and the second positive input node. The eighth resistor comprises an eighth resistance ($R_8$) and is coupled between a reference input node and the second positive input node. The DC reference voltage is supplied to the reference input node. The third capacitor is coupled between the detection voltage node and the second negative input node. The fourth capacitor is coupled between the second positive input node and the reference input node. The third capacitor and the fourth capacitor are configured to filter out high-frequency noise.

According to an embodiment of the ground-resistance detection device, the AC-voltage detection circuit comprises: a second clamp circuit and a third clamp circuit. The second clamp circuit is coupled to the second negative input node and configured to provide a clamp protection for the second negative input node. The third clamp circuit is coupled to the second positive input node and configured to provide the clamp protection for the second positive input node.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
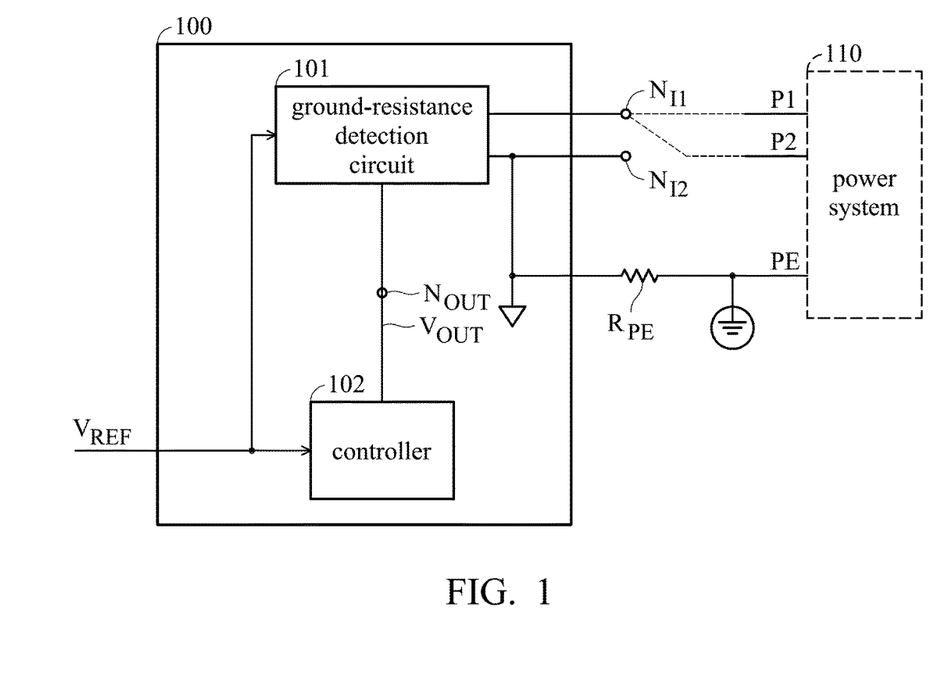
FIG. 1 is a block diagram of a ground-resistance detection device in accordance with an embodiment of the invention.

FIG. 1 is a block diagram of a ground-resistance detection device in accordance with an embodiment of the invention. As shown in FIG. 1, the ground-resistance detection device 100 includes the ground-resistance detection circuit 101 and the controller 102. The ground-resistance detection device 100 is coupled to the power system 110 which includes the first power line P1, the second power line P2, and the protective earth PE. The power system is configured to output an AC voltage. According to an embodiment of the invention, the ground-resistance detection device 100 is a power converter which is coupled to a power system, such as an electric vehicle charging station.

The ground-resistance detection circuit 101 includes the first input node $N_{f1}$ and the second input node $N_{f2}$. The first input node $N_{f1}$ is coupled to the first power line P1 or the second power line P2, and the second input node $N_{f2}$ is coupled to the ground terminal. There is the ground resistance $R_{PE}$ between the protective earth PE and the ground terminal. The ground-resistance detection circuit 101 generates the DC output voltage $V_{OUT}$ at the output node $N_{OUT}$ according to the voltage of the first output node $N_{f1}$, the voltage of the second output node $N_{f2}$, and the DC reference voltage $V_{REF}$.

It should be understood that the protective earth PE is the earth line of the power system, and the ground terminal is the local ground terminal of the ground-resistance detection device 100. The advantage of the invention is that it is able to estimate the resistance from the local ground terminal to the remote earth line by only using of the DC supply voltage and the local ground terminal of the ground-resistance detection device 100. The estimation method of the invention will be described in detail in the following description.

According to an embodiment of the invention, the controller 102 determines the resistance value of the ground resistance $R_{PE}$ according to the voltage value of the DC reference voltage $V_{REF}$ and that of the DC output voltage $V_{OUT}$. The detailed relationship of the ground resistance $R_{PE}$ with the DC reference voltage $V_{REF}$ and the DC output voltage $V_{OUT}$ will be described in the following description.

According to an embodiment of the invention, the power system 110 is a single-phase three-wire system which includes a live wire, a neutral wire, and the earth line. That is, the first power line P1 and the second power line P2 are the live wire and the neutral wire, respectively. When the first input node $N_{f1}$ is coupled to either the live wire or the neutral wire, the ground-resistance detection circuit 101 is able to generate the DC output voltage $V_{OUT}$ according to the voltage of the first input node $N_{f1}$, the voltage of the second input node $N_{f2}$, and the DC reference voltage $V_{REF}$.

According to another embodiment of the invention, the power system 110 is a two-phase three-wire system which includes the first live wire (Line 1), the second live wire (Line 2), and the protective earth (PE). That is, the first power line P1 and the second power line P2 are the first live wire (Line 1) and the second live wire (Line 2), respectively. When the first input node $N_{f1}$ is coupled to either the first live wire (Line 1) or the second live wire (Line 2), the ground-resistance detection circuit 101 is able to generate the DC output voltage $V_{OUT}$ according to the voltage of the first input node $N_{f1}$, the voltage of the second input node $N_{f2}$, and the DC reference voltage $V_{REF}$.

According to yet another embodiment of the invention, the power system 110 is a three-phase four-wire system which includes the first live wire (R), the second live wire (S), the third live wire (T), and the protective earth (PE). There are 120 degree phase shift between each two of the first live wire (R), the second live wire (S), and the third live wire (T). Therefore, the power system 110 has the first power line P1, the second power line P2, and the third power line P3, in which the first power line P1, the second power line P2, and the third power line P3 of the power system 110 are the first live wire, the second live wire, and the third live wire, respectively. Whether the first input node $N_{f1}$ is coupled to any one of the first live wire, the second live wire, or the third live wire, the ground-resistance detection circuit 101 is able to generate the DC output voltage $V_{OUT}$ according to the voltage of the first input node $N_{I1}$, the voltage of the second input node $N_{I2}$, and the DC reference voltage $V_{REF}$.

Figure 2:
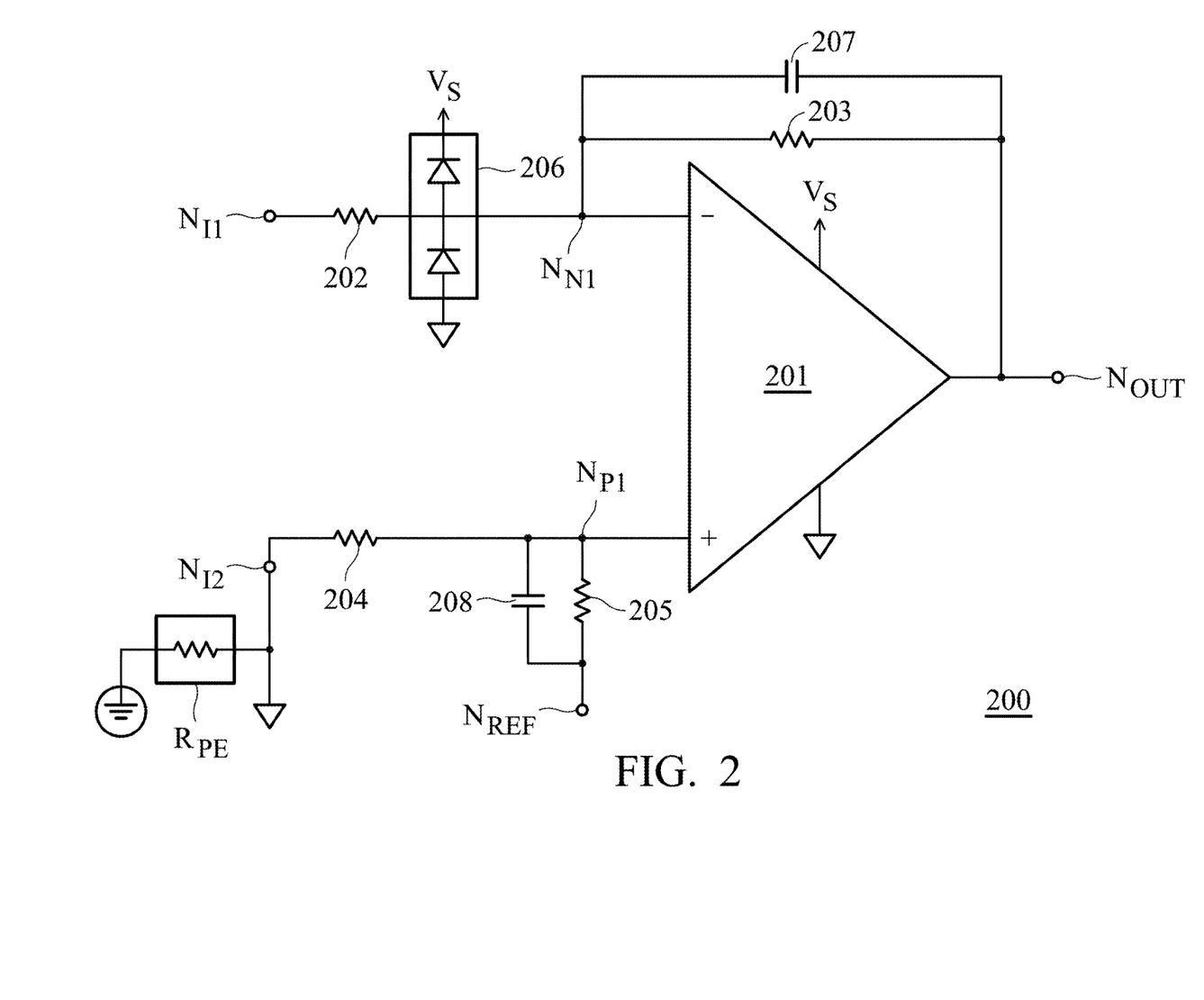
FIG. 2 is a schematic diagram of a ground-resistance detection circuit in accordance with an embodiment of the invention.

FIG. 2 is a schematic diagram of a ground-resistance detection circuit in accordance with an embodiment of the invention. As shown in FIG. 2, the ground-resistance detection circuit 200 includes the first operation amplifier 201, the first resistor 202, the second resistor 203, the third resistor 204, the fourth resistor 205, the first clamp circuit 206, the first capacitor 207, and the second capacitor 208.

The first operation amplifier 201 includes the first positive input node $N_{P1}$ and the first negative input node $N_{N1}$. The first operation amplifier 201 is supplied by the DC supply voltage $V_S$ and compares the voltage of the first negative input node $N_{N1}$ with that of the first positive input node $N_{P1}$ to generate the DC output voltage $V_{OUT}$ at the output node $N_{OUT}$.

The first resistor 202 has the first resistance $R_1$ and is coupled between the first input node $N_{I1}$ and the first negative input node $N_{N1}$. According to an embodiment of the invention, the first resistor 202 is implemented by several resistors connected in series to meet the isolation distance according to the safety regulation. The second resistor 203 has the second resistance $R_2$ and is coupled between the first negative input node $N_{N1}$ and the output node $N_{OUT}$.

The third resistor 204 has the third resistance $R_3$ and is coupled between the second input node $N_{I2}$ and the first positive input node $N_{P1}$, in which the second input node $N_{I2}$ is coupled to the ground terminal. The fourth resistor 205 has the fourth resistance $R_4$ and is coupled between the reference input node $N_{REF}$ and the first positive input node $N_{P1}$, in which the DC reference voltage $V_{REF}$ is supplied to the reference input node $N_{REF}$.

The first clamp circuit 206, which is coupled to the first negative input node $N_{N1}$, is configured to eliminate the surge voltage at the first negative input node $N_{N1}$. Namely, the first clamp circuit 206 is configured to provide the clamping protection for the first negative input node $N_{N1}$. The first capacitor 207 is coupled between the output node $N_{OUT}$ and the first negative input node $N_{N1}$, and the second capacitor 208 is coupled between the first positive input node $N_{P1}$ and the reference input node $N_{REF}$, in which the ground-resistance detection circuit 200 is designed as a low-pass amplifier by the first capacitor 207 and the second capacitor 208. The first capacitor 207 and the second capacitor 208 are configured to choose a bandwidth for filtering out the AC signal from the first input node $N_{I1}$ and the second input node $N_{I2}$, so that the influence of the AC signal on the ground-resistance detection circuit 200 is diminished, and DC output voltage $V_{OUT}$ is then able to be generated at the output node $N_{OUT}$ by the low-pass characteristics of the ground-resistance detection circuit 200.

When the DC reference voltage $V_{REF}$ is supplied to the ground-resistance detection circuit 200, the ground-resistance detection circuit 200 generates the DC output voltage $V_{OUT}$ according to the voltage of the first output node $N_{I1}$, the voltage of the second output node $N_{I2}$, and the DC reference voltage $V_{REF}$. The controller 102 further calculates the ground resistance $R_{PE}$ according to the difference between the DC output voltage $V_{OUT}$ and the DC reference voltage $V_{REF}$.

According to an embodiment of the invention, the DC supply voltage $V_S$ is 12V, the DC reference voltage $V_{REF}$ is 6V, and the ground resistance $R_{PE}$ is equivalent to be coupled between the first input node $N_{I1}$ and the ground terminal. The first resistance $R_1$ and the third resistance $R_3$ are both 1000 kΩ. The second resistance $R_2$ and the fourth resistance $R_4$ are both 402 kΩ. However, the first resistance $R_1$, the second resistance $R_2$, the third resistance $R_3$, and the fourth resistance $R_4$ can be randomly selected. For the convenience of explanation, the first resistance $R_1$ equal to the third resistance $R_3$ and the second resistance $R_2$ equal to the fourth resistance $R_4$ are selected herein.

The first input node $N_{I1}$ is coupled to either the first power line P1 or the second power line P2 of the power system 110 in FIG. 1, and the power system 110 provides the AC voltage through the first power line P1 and the second power line P2. Since the ground-resistance detection circuit 200 is designed as a circuit with low-pass characteristics, the output voltage $V_{OUT}$ is simply DC. Therefore, only the DC component is considered in the following analysis. The voltage value $V_{P1}$ of the first positive input node $N_{P1}$ could be obtained from the Eq. 1:

$$V_{P1} = \frac{R_3}{R_3 + R_4} \cdot V_{REF} \quad \text{(Eq. 1)}$$

Since the third resistance $R_3$ is 1000 kΩ, the fourth resistance $R_4$ 402 kΩ, and the DC reference voltage $V_{REF}$ is 6V, the voltage value $V_{P1}$ of the first positive node $N_{P1}$ is 4.28V. Since the gain of an ideal operation amplifier is infinite, the relationship between the first positive input node $N_{P1}$ and the first negative input node $N_{N1}$ could be regarded as virtual short-circuit when the first operation amplifier 201 is regarded as an ideal operation amplifier.

That is, the voltage value $V_{N1}$ of the first negative input node $N_{N1}$ is equal to the voltage value $V_{P1}$ of the first positive input node $N_{P1}$ which is 4.28V. The DC output voltage $V_{OUT}$ could be obtained from the Eq. 2:

$$V_{OUT} = \frac{R_1 + R_2 + R_{PE}}{R_1 + R_{PE}} \cdot V_{P1} \quad \text{(Eq. 2)}$$

The controller 102 in FIG. 1 obtains the resistance value of the ground resistance $R_{PE}$ by the difference of the DC reference voltage $V_{REF}$ and the DC output voltage $V_{OUT}$.

The Eq. 3 could be derived from the Eq. 2 and the Eq. 1, the controller 102 obtains the resistance value of the ground resistance $R_{PE}$ from the calculation of Eq. 3.

$$R_{PE} = \frac{R_3 \cdot (R_1 + R_2) \cdot V_{REF} - R_1 \cdot (R_3 + R_4) \cdot V_{OUT}}{(R_3 + R_4) \cdot V_{OUT} - R_3 \cdot V_{REF}} \quad \text{(Eq. 3)}$$

In other words, the controller 102 in FIG. 1 could obtain the resistance value of the ground resistance $R_{PE}$ from the calculation of Eq. 3, according to the first resistance $R_1$, the second resistance $R_2$, the DC reference voltage $V_{REF}$, and the DC output voltage $V_{OUT}$.

According to yet another embodiment of the invention, since detection errors are caused by the parasitic capacitance along the signal path, and the capacitors are configured to filter out the interference, the calculation of the ground resistance $R_{PE}$ shown above requires corresponding amendments.

Figure 3:
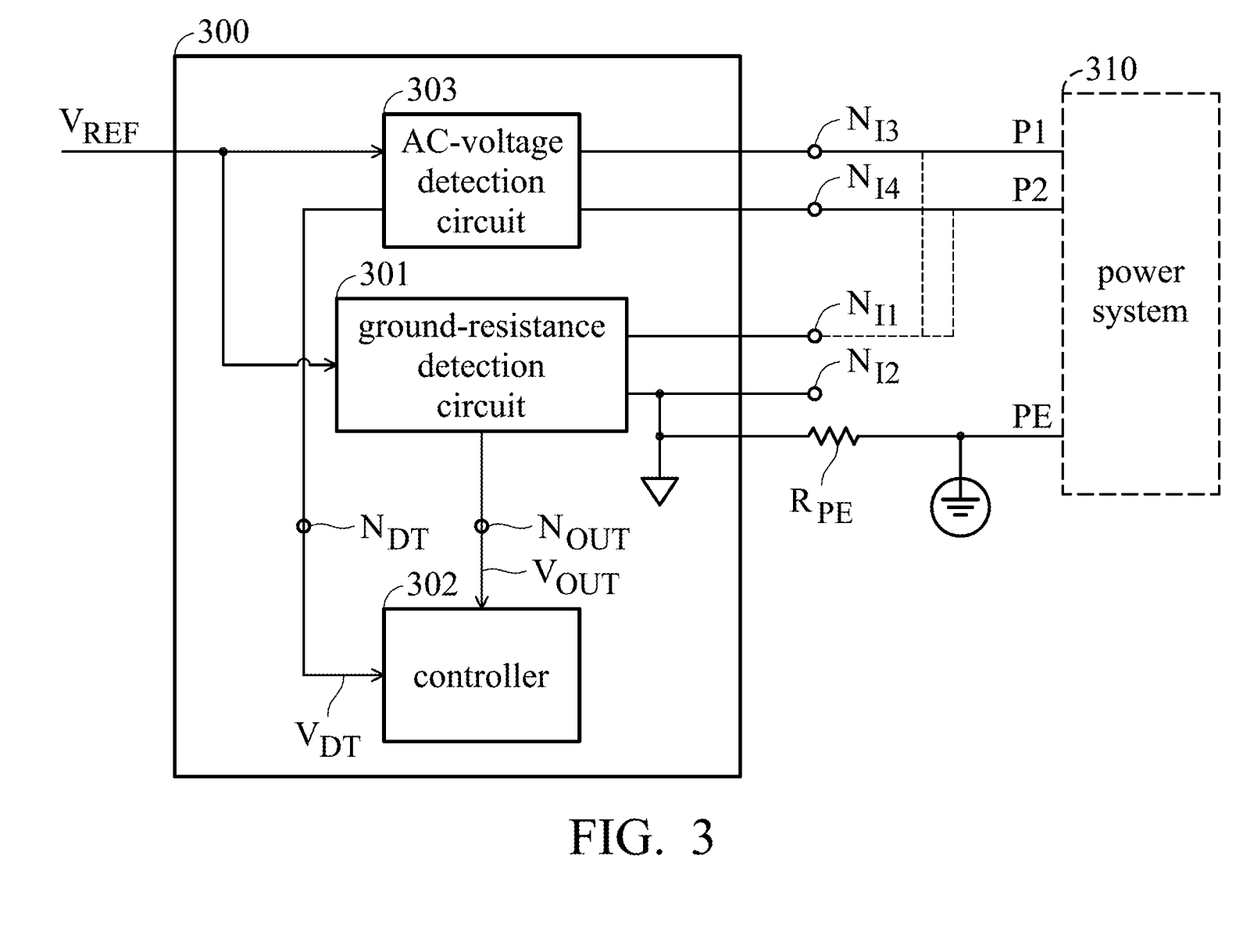
FIG. 3 is a block diagram of a ground-resistance detection device in accordance with another embodiment of the invention.

FIG. 3 is a block diagram of a ground-resistance detection device in accordance with another embodiment of the invention. As shown in FIG. 3, the ground-resistance detection device 300 includes the ground-resistance detection circuit 301, the controller 302, and the AC-voltage detection circuit 303. Comparing FIG. 3 with FIG. 1, the ground-resistance detection device 300 has the AC-voltage detection circuit 303 that the ground-resistance detection device 100 doesn't.

The AC-voltage detection circuit 303 includes the third input node $N_{I3}$ and the fourth input node $N_{I4}$. The third input node $N_{I3}$ and the fourth input node $N_{I4}$ of the AC-voltage detection circuit 303 are respectively coupled to the first power line P1 and the second power line P2, and are configured to detect the AC voltage $V_M$ of the first power line P1 and the second power line P2 to generate the detection voltage $V_{DT}$ at the detection voltage node $N_{DT}$.

It should be understood that the protective earth PE and the ground terminal are the earth line of the power system 310 and the ground terminal of the ground-resistance detection device 300, respectively.

The detection voltage $V_{DT}$ includes the DC-part voltage $V_{DC}$ and the AC-part voltage $V_{AC}$. The controller 302 obtains the resistance value of the ground resistance $R_{PE}$ from the calculation of Eq. 4, according to the DC-part voltage $V_{DC}$ and the DC output voltage $V_{OUT}$. In other words, the ground resistance $R_{PE}$ is obtained from the calculation of Eq. 4 with the DC-part voltage $V_{DC}$ being substituted for the DC reference voltage $V_{REF}$. The controller 302 further obtains the AC voltage $V_M$, which is provided by the power system 310 through the first power line P1 and the second power line P2, by the amplitude AM of the AC-part voltage $V_{AC}$.

$$R_{PE} = \frac{R_3 \cdot (R_1 + R_2) \cdot V_{DC} - R_1 \cdot (R_3 + R_4) \cdot V_{OUT}}{(R_3 + R_4) \cdot V_{OUT} - R_3 \cdot V_{DC}} \quad \text{(Eq. 4)}$$

According to an embodiment of the invention, since the controller 302 requires the AC-voltage detection circuit 303 to detect the AC voltage VM provided by the power system 310, when the controller 302 obtains the ground resistance $R_{PE}$ by a calculation with the DC reference voltage $V_{REF}$ and the DC output voltage $V_{OUT}$, there should be an additional pin to provide the DC reference voltage $V_{REF}$ to the controller 302. That is, when the controller 302 obtains the ground resistance $R_{PE}$ by a calculation with the DC-part voltage $V_{DC}$ of the detection voltage $V_{DT}$ and the DC output voltage $V_{OUT}$, the additional pin to provide the DC reference voltage $V_{REF}$ to the controller 302 is not necessary, and the pin of the controller 302 could be saved for other purposes.

Figure 4:
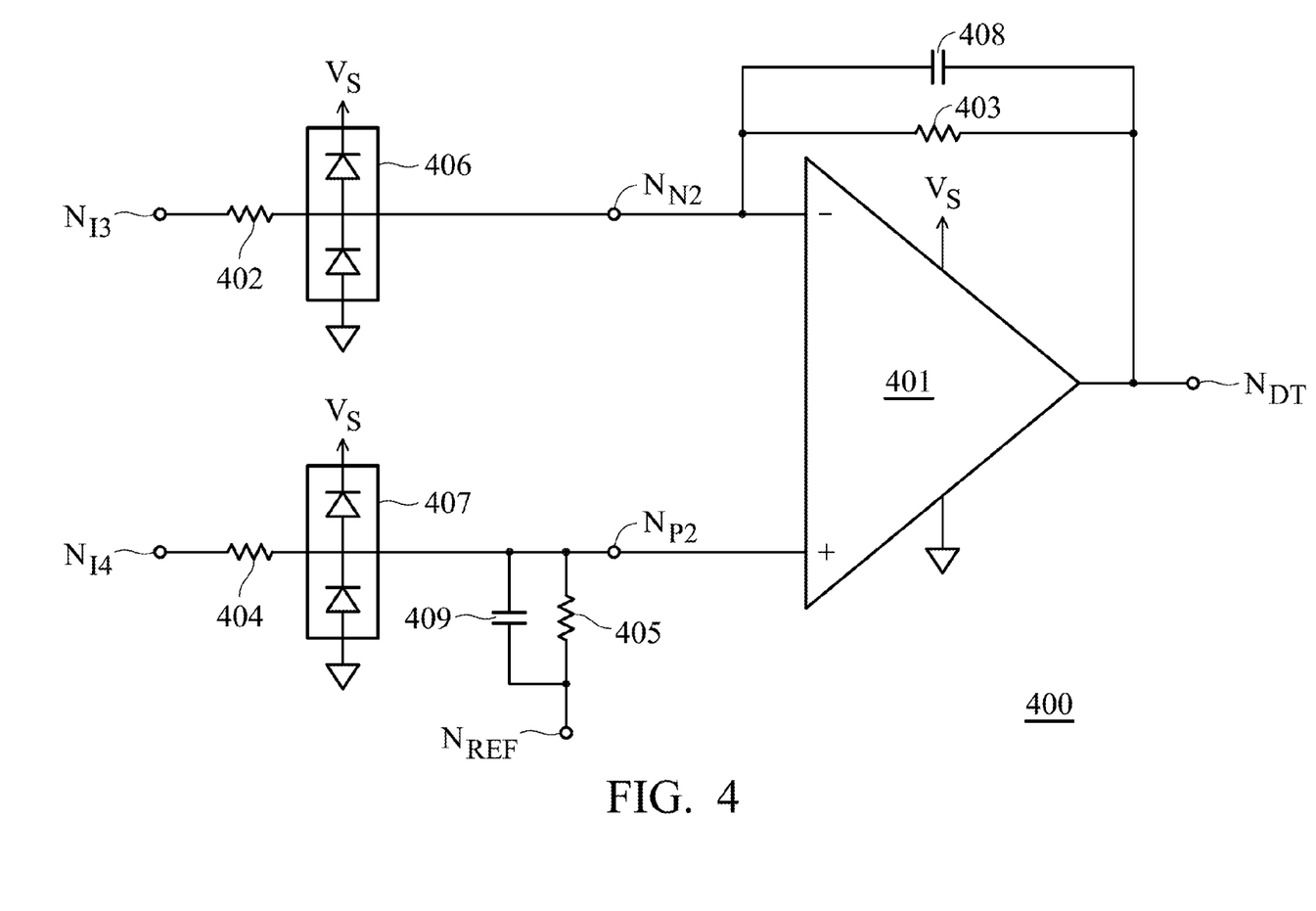
FIG. 4 is a schematic diagram of an AC voltage detection circuit in accordance with an embodiment of the invention.

FIG. 4 is a schematic diagram of an AC voltage detection circuit in accordance with an embodiment of the invention. As shown in FIG. 4, the AC-voltage detection circuit 400 includes the second operation amplifier 401, the fifth resistor 402, the sixth resistor 403, the seventh resistor 404, the eighth resistor 405, the second clamp circuit 406, the third clamp circuit 407, the third capacitor 408, and the fourth capacitor 409.

The second operation amplifier 401 includes the second positive input node $N_{P2}$ and the second negative input node $N_{N2}$, in which the second operation amplifier 401 receives the DC supply voltage $V_S$ and compares the voltage of the second positive input node $N_{P2}$ to that of the second negative input node $N_{N2}$ to generate the detection voltage $V_{DT}$ at the detection voltage node $N_{DT}$.

The fifth resistor 402 has the fifth resistance $R_5$ and is coupled between the third input node $N_{I3}$ and the second negative input node $N_{N2}$. According to an embodiment of the invention, the fifth resistor 402 is implemented by several resistors connected in series to meet the isolation distance according to the safety regulation. The sixth resistor 403 has the sixth resistance $R_6$ and is coupled between the second negative input node $N_{N2}$ and the detection voltage node $N_{DT}$.

The seventh resistor 404 has the seventh resistance $R_7$ and is coupled between the fourth input node $N_{I4}$ and the second positive input node $N_{P2}$. According to an embodiment of the invention, the seventh resistor 404 is implemented by several resistors in series to meet the isolation distance according to the safety regulation. The eighth resistor 405 has the eighth resistance $R_8$ and is coupled between the reference input node $N_{REF}$ and the second positive input node $N_{P2}$, in which the DC reference voltage VREF is supplied to the reference input node $N_{REF}$.

The second clamp circuit 406, which is coupled to the second negative input node $N_{N2}$, is configured to eliminate the surge voltage of the second negative input node $N_{N2}$. The third clamp circuit 407, which is coupled to the second positive input node $N_{P2}$, is configured to eliminate the surge voltage of the second positive input node $N_{P2}$.

The third capacitor 408 is coupled between the detection voltage node $N_{DT}$ and the second negative input node $N_{N2}$. The fourth capacitor 409 is coupled between the second positive input node $N_{P2}$ and the reference input node $N_{REF}$, in which the third capacitor 408 and the fourth capacitor 409 are configured to choose a bandwidth to let the AC signal pass, so that the detection voltage $V_{DT}$ includes the DC-part voltage $V_{DC}$ and the AC-part voltage $V_{AC}$, and the noise is able to be filtered out.

According to an embodiment of the invention, the DC supply voltage $V_S$ is 12V, the DC reference voltage $V_{REF}$ is 6V, and the root mean square value of the AC voltage $V_M$, which is provided by the power system 310 through the first power line P1 and the second power line P2, is 220V. The fifth resistance $R_5$ and the seventh resistance $R_7$ are both 1000 kΩ, and the sixth resistance $R_6$ and the eighth resistance $R_8$ are 12.1 kΩ.

When the third input node $N_{I3}$ and the fourth input node $N_{I4}$ are respectively coupled to the first power line P1 and the second power line P2, the AC voltage $V_M$ between the third input node $N_{I3}$ and the fourth input node $N_{I4}$ is 220V. Therefore, when the root mean square value of the AC voltage $V_M$ is 220V, the peak value is 311.08V and the amplitude AM of the AC-part voltage $V_{AC}$ of the detection voltage $V_{DT}$ is 3.764V.

In other words, the controller 302 could derive the real AC voltage $V_M$ according to the amplitude AM of the AC-part voltage $V_{AC}$ of the detection voltage $V_{DT}$, the fifth resistance $R_5$, the sixth resistance $R_6$, the seventh resistance $R_7$, and the eighth resistance $R_8$.

Therefore, one skilled in the art could precisely derive the ground resistance $R_{PE}$ by using of the ground-resistance detection circuit 200 in FIG. 2 of the invention and the calculation of Eq. 3 with the design parameters of the first resistor 202, the second resistor 203, the third resistor 204, the fourth resistor 205, and the DC reference voltage $V_{REF}$ in the ground-resistance detection circuit 200.

When it is necessary to reduce the number of the input pins of the controller, it is possible to substitute the DC-part voltage $V_{DC}$ of the detection voltage $V_{DT}$, which is generated by the AC-voltage detection circuit 400 in FIG. 4 of the invention, for the DC reference voltage $V_{REF}$, and then the ground resistance $R_{PE}$ can be precisely obtained from the calculation of Eq. 4. The controller is able to substitute the average of the generated detection voltage $V_{DT}$ for the DC reference voltage $V_{REF}$, and the AC-part voltage $V_{AC}$ of the detection voltage $V_{DT}$ could be also an input pin of the controller 302 for providing the DC reference voltage $V_{REF}$ to the controller 302.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A ground-resistance detection device, coupled to a power system, wherein the power system comprises a first power line, a second power line, and a protective earth, comprising:
    a ground-resistance detection circuit, comprising a first input node and a second input node, wherein the first input node is coupled to either the first power line or the second power line, and the second input node is coupled to a ground terminal, wherein the ground-resistance detection circuit generates a DC output voltage ($V_{OUT}$) according to a voltage of the first input node, a voltage of the second input node, and a DC reference voltage ($V_{REF}$), wherein the ground-resistance detection circuit further comprises:
    a first operation amplifier, comprising a first positive input node and a first negative input node, wherein the first operation amplifier is supplied by a DC supply voltage, and compares a voltage of the first positive input node with a voltage of the first negative input node to generate the DC output voltage at an output node; and
    a controller, determining a ground resistance ($R_{PE}$) between the protective earth and the ground terminal according to the DC reference voltage and the DC output voltage.

2. The ground-resistance detection device of claim 1, wherein the power system is a single-phase three-wire system, and the power system comprises a live wire, a neutral wire, and the protective earth, wherein the first input node is coupled to either the live wire or the neutral wire.

3. The ground-resistance detection device of claim 1, wherein the power system is a two-phase three-wire system, and the power system comprises a first live wire, a second live wire, and the protective earth, wherein the first live wire comprise a first phase and the second live wire comprises a second phase, wherein the first input node is coupled to either the first live wire or the second live wire.

4. The ground-resistance detection device of claim 1, wherein the power system is a three-phase four-wire system, and the power system comprises a first live wire, a second live wire, a third live wire, and the protective earth, wherein the first live wire comprise a first phase, the second live wire comprises a second phase, and the third live wire comprises a third phase, wherein the first input node is coupled to the first live wire, the second live wire, or the third live wire.

5. The ground-resistance detection device of claim 1, wherein the ground-resistance detection circuit further comprises:
    a first resistor, comprising a first resistance ($R_1$) and coupled between the first input node and the first negative input node;
    a second resistor, comprising a second resistance ($R_2$) and coupled between the first negative input node and the output node;
    a third resistor, comprising a third resistance ($R_3$) and coupled between the second input node and the first positive input node;
    a fourth resistor, comprising a fourth resistance ($R_4$) and coupled between a reference input node and the first positive input node, wherein the DC reference voltage ($V_{REF}$) is supplied to the reference input node;
    a first capacitor, coupled between the output node and the first negative input node; and
    a second capacitor, coupled between the first positive input node and the reference input node, wherein the first input node comprises an AC signal, and the first capacitor and the second capacitor are configured to select a bandwidth to filter out the AC signal.

6. The ground-resistance detection device of claim 5, wherein the ground-resistance detection circuit further comprises:
    a first clamp circuit, coupled to the first negative input node and configured to provide a clamp protection for the first negative input node.

7. The ground-resistance detection device of claim 5, wherein the controller obtains the ground resistance from an equation:

$$R_{PE} = (R_3 \cdot (R_1+R_2) \cdot V_{REF} - R_1 \cdot (R_3+R_4) \cdot V_{OUT}) / ((R_3+R_4) \cdot V_{OUT} - R_3 \cdot V_{REF}).$$

8. The ground-resistance detection device of claim 1, further comprising:
    an AC-voltage detection circuit, comprising a third input node and a fourth input node, wherein the third input node is coupled to the first power line, and the fourth input node is coupled to the second power line, wherein the AC-voltage detection circuit generates a detection voltage according to an AC voltage between the third input node and the fourth input node, wherein the detection voltage comprises a DC-part voltage ($V_{DC}$) and an AC-part voltage, wherein the controller determines the AC voltage ($V_M$) according to amplitude of the AC-part voltage, and determines the ground-resistance according to the DC-part voltage and the DC output voltage.

9. The ground-resistance detection device of claim 8, wherein the AC-voltage detection circuit comprises:
    a second operation amplifier, comprising a second positive input node and a second negative input node, wherein the second operation amplifier receives a DC supply voltage and compares a voltage of the second positive input node with a voltage of the second negative input node to generate the detection voltage at a detection voltage node;
    a fifth resistor, comprising a fifth resistance ($R_5$) and coupled between the third input node and the second negative input node;
    a sixth resistor, comprising a sixth resistance ($R_6$) and coupled between the second negative input node and the detection voltage node;
    a seventh resistor, comprising a seventh resistance ($R_7$) and coupled between the fourth input node and the second positive input node;
    an eighth resistor, comprising an eighth resistance ($R_8$) and coupled between a reference input node and the second positive input node, wherein the DC reference voltage is supplied to the reference input node;
    a third capacitor, coupled between the detection voltage node and the second negative input node; and
    a fourth capacitor, coupled between the second positive input node and the reference input node, wherein the third capacitor and the fourth capacitor are configured to filter out high-frequency noise.

10. The ground-resistance detection device of claim 9, wherein the AC-voltage detection circuit comprises:
    a second clamp circuit, coupled to the second negative input node and configured to provide a clamp protection for the second negative input node; and
    a third clamp circuit, coupled to the second positive input node and configured to provide the clamp protection for the second positive input node.

* * * * *